United States Patent
Perner

(10) Patent No.: US 9,384,824 B2
(45) Date of Patent: Jul. 5, 2016

(54) LIST SORT STATIC RANDOM ACCESS MEMORY

(75) Inventor: Frederick Perner, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 38 days.

(21) Appl. No.: 14/396,331

(22) PCT Filed: Jul. 10, 2012

(86) PCT No.: PCT/US2012/046018
§ 371 (c)(1),
(2), (4) Date: Oct. 22, 2014

(87) PCT Pub. No.: WO2014/011149
PCT Pub. Date: Jan. 16, 2014

(65) Prior Publication Data
US 2015/0162075 A1    Jun. 11, 2015

(51) Int. Cl.
*G11C 11/41* (2006.01)
*G11C 11/419* (2006.01)
*G11C 15/04* (2006.01)
(Continued)

(52) U.S. Cl.
CPC ............ *G11C 11/419* (2013.01); *G11C 11/412* (2013.01); *G11C 15/04* (2013.01); *G11C 19/28* (2013.01)

(58) Field of Classification Search
CPC .. G11C 11/41; G11C 11/411; G11C 11/4113; G11C 11/4116; G11C 11/412; G11C 11/4125; G11C 11/413; G11C 11/414; G11C 11/415; G11C 11/416; G11C 11/417; G11C 11/418; G11C 11/419

USPC .......................................................... 365/154
See application file for complete search history.

(56) References Cited

U.S. PATENT DOCUMENTS

| 3,670,313 A | 6/1972 | Beausoleil et al. |
| 3,708,690 A | 1/1973 | Paivinen |
| 3,760,382 A | 9/1973 | Itoh |

(Continued)

FOREIGN PATENT DOCUMENTS

| EP | 0827156 | 4/1998 |
| JP | 5066921 | 9/1993 |

OTHER PUBLICATIONS

Chen-Yi Lee et al., "High-Speed Median Filter Designs Using Shiftable Content-Addressable Memory," IEEE Trans. Circuits and Systems for Video Tech., vol. 4, No. 6, Dec. 1994, pp. 544-549.

(Continued)

*Primary Examiner* — Hoai V Ho
*Assistant Examiner* — Roberto Mancera
(74) *Attorney, Agent, or Firm* — North Shore Associates

(57) ABSTRACT

A list sort static random access memory (LSSRAM) unit cell includes a static random access memory (SRAM) cell having a pair of cross-coupled elements to store data and a dynamic/static (D/S) mode selector to selectably switch the LSSRAM unit cell between a dynamic storage mode and a static storage mode. The LSSRAM unit cell further includes a swap selector to swap the stored data with data stored in an adjacent memory cell during the dynamic storage mode when the swap selector is activated, and a data comparator to compare the stored data in the SRAM cell with the data stored in the adjacent memory cell and to activate the swap selector according to a result of the comparison.

15 Claims, 7 Drawing Sheets

(51) Int. Cl.
*G11C 19/28* (2006.01)
*G11C 11/412* (2006.01)

(56) References Cited

U.S. PATENT DOCUMENTS

| | | | |
|---|---|---|---|
| 3,797,992 A | 3/1974 | Straitz, III | |
| 3,893,088 A | 7/1975 | Bell | |
| 4,037,205 A | 7/1977 | Edelberg et al. | |
| 4,133,043 A | 1/1979 | Hiroshima et al. | |
| 4,322,635 A | 3/1982 | Redwine | |
| 4,532,606 A | 7/1985 | Phelps | |
| 4,823,312 A | 4/1989 | Michael et al. | |
| 4,845,670 A | 7/1989 | Nishimoto et al. | |
| 4,864,544 A * | 9/1989 | Spak | G06F 7/78 327/203 |
| 5,153,846 A | 10/1992 | Rao | |
| 5,299,156 A | 3/1994 | Jiang et al. | |
| 5,504,919 A | 4/1996 | Lee et al. | |
| 5,543,748 A | 8/1996 | Ando | |
| 5,777,942 A | 7/1998 | Dosaka et al. | |
| 5,835,932 A * | 11/1998 | Rao | G06F 12/0215 365/230.03 |
| 5,867,443 A * | 2/1999 | Linderman | G11C 11/412 365/154 |
| 5,930,323 A | 7/1999 | Tang et al. | |
| 5,940,852 A * | 8/1999 | Rangasayee | G11C 11/41 365/189.07 |
| 5,953,738 A * | 9/1999 | Rao | G06F 12/0893 711/105 |
| 5,978,293 A * | 11/1999 | Taylor | G11C 11/419 365/205 |
| 6,021,075 A | 2/2000 | Ueno | |
| 6,061,417 A | 5/2000 | Kelem | |
| 6,141,739 A | 10/2000 | Provence et al. | |
| 6,239,638 B1 | 5/2001 | Masuda | |
| 6,263,400 B1 * | 7/2001 | Rangasayee | G11C 15/04 365/49.17 |
| 6,282,143 B1 * | 8/2001 | Zhang | G11C 8/16 365/189.08 |
| 6,362,660 B1 | 3/2002 | Deng | |
| 6,522,562 B2 * | 2/2003 | Foss | G11C 15/04 365/168 |
| 6,556,482 B2 * | 4/2003 | Shimoyama | G11C 7/22 365/189.04 |
| 6,745,216 B1 | 6/2004 | Nakamura | |
| 6,834,005 B1 | 12/2004 | Parkin | |
| 7,051,153 B1 | 5/2006 | Lin et al. | |
| 7,394,681 B1 * | 7/2008 | Masleid | G11C 11/413 365/154 |
| 7,474,574 B1 * | 1/2009 | Agarwal | G11C 14/00 365/189.05 |
| 7,508,701 B1 | 3/2009 | Liang et al. | |
| 7,573,310 B2 | 8/2009 | Yang et al. | |
| 7,609,542 B2 | 10/2009 | Adams et al. | |
| 7,890,722 B1 | 2/2011 | Steele, Jr. et al. | |
| 2001/0040827 A1 * | 11/2001 | Dosaka | G11C 7/1018 365/189.011 |
| 2002/0006071 A1 * | 1/2002 | Ikeda | G11C 11/005 365/230.03 |
| 2003/0156454 A1 | 8/2003 | Wei et al. | |
| 2004/0027863 A1 | 2/2004 | Lee et al. | |
| 2006/0002177 A1 * | 1/2006 | Zheng | G11C 11/417 365/154 |
| 2006/0274585 A1 * | 12/2006 | Jung | G11C 29/848 365/200 |
| 2007/0080345 A1 | 4/2007 | Joo et al. | |
| 2008/0151624 A1 * | 6/2008 | Still | G11C 14/00 365/185.08 |
| 2010/0226183 A1 | 9/2010 | Kim | |
| 2010/0246276 A1 | 9/2010 | Noh | |
| 2013/0282974 A1 * | 10/2013 | Joisha | G11C 19/00 711/109 |
| 2014/0126309 A1 * | 5/2014 | Kelly | G11C 19/28 365/189.12 |
| 2014/0247673 A1 * | 9/2014 | Muralimanohar | G11C 19/188 365/189.02 |
| 2014/0297985 A1 * | 10/2014 | Graefe | G11C 15/04 711/165 |
| 2014/0359209 A1 * | 12/2014 | Perner | G11C 19/28 711/106 |
| 2014/0379977 A1 * | 12/2014 | Perner | G11C 11/412 711/105 |
| 2015/0006809 A1 * | 1/2015 | Harizopoulos | G11C 19/00 711/109 |

OTHER PUBLICATIONS

International Searching Authority, The International Search Report and the Written Opinion, Jan. 30, 2013, 11 Pages.
Noguchi, H. et al., 0.45-v Operating Vt—Variation Tolerant 9T/18T Dual-port SRAM, (Research Paper), 12th International Symposium on Quality Electronic Design (ISQED), Mar. 14-16, 2011, pp. 1-4.
PCT Search Report, PCT/US2011/058461, May 31, 2012.
Roberto Perez-Andrade et al., "A Versatile Linear Insertion Sorter Based on a FIFO Scheme," IEEE Computer Society Annual Symposium on VLSI, 2008, pp. 357-362.

* cited by examiner

LIST SORT STATIC RANDOM ACCESS MEMORY

CROSS-REFERENCE TO RELATED APPLICATIONS

N/A

STATEMENT REGARDING FEDERALLY SPONSORED RESEARCH OR DEVELOPMENT

N/A

BACKGROUND

Modern computers and related processing systems typically include a processor and some form of memory. The processor is generally responsible for performing the various computational tasks of the computer while the memory stores data that is used in and generated by the computational tasks. The architectural division of processing by the processor and data storage by the memory has proven successful for nearly the entire history of such systems.

For example, a typical general-purpose computer usually includes a central processing (CPU) and a main memory that communicate with one another over one or more communication channels (e.g., data, command and address buses). Typically, the CPU provides facilities to perform various arithmetic and logical operations, to provide operational sequencing, and to otherwise control aspects of the general-purpose computer. For example, virtually all CPUs provide functions or operations for reading data from memory, writing data to memory, and executing programs comprising a set of instructions that utilizes the data to perform a predefined task. In addition, CPUs may handle input/output (I/O) allowing communication with peripherals as well as subsystems outside of the general-purpose computer. CPUs may even provide graphics processing to handle generating and updating a graphical display (e.g., a monitor), in some examples.

In contrast, the main memory of modern computers, which can include one or more of static random access memory (SRAM), dynamic random access memory (DRAM), read-only memory (ROM), programmable ROM (PROM), flash memory and a variety of other memory types, typically provides a relatively narrow set of capabilities. Principal among these capabilities is storing computer programs and data that are executed and used by the CPU. Among other limited capabilities that may be found in, or that are often associated with, the main memory of modern computers are certain memory management functions. For example, DRAM memory subsystems of main memory may possess circuitry for automatic refresh of data stored therein.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which:

FIGS. 1A-1B illustrate a list of data words, according to an example consistent with the principles described herein.

Figure 2:
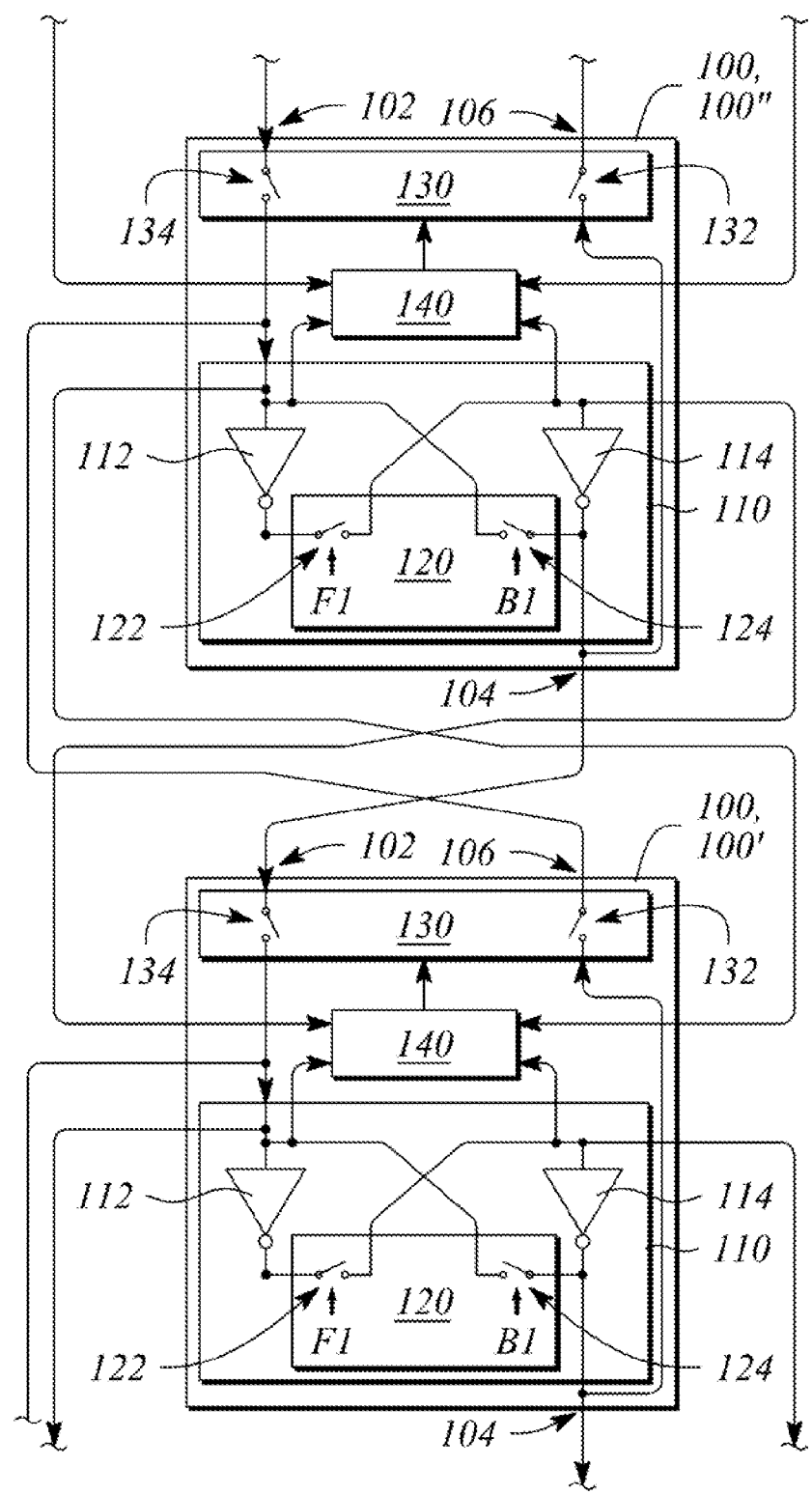
FIG. 2 illustrates a block diagram of a list sort static random access memory (LSSRAM) unit cell, according to an example consistent with the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide memory with built-in data sorting capability. In particular, a contiguous subset or list of data stored as 'data words' in selected rows of the memory is sorted by the memory itself to implement the built-in data sorting capability. As such, the memory described herein may be referred to as a 'list sort' memory because it sorts the list of stored data words. Further, the list sort memory may employ static random access memory (SRAM) and thus may be referred to as list sort SRAM (LSSRAM), according to various examples.

In various examples, the list sort is accomplished by swapping data words within the list until the list is sorted. The sorted list may organize the data words into either an ascending (i.e., non-decreasing) or descending (i.e., non-increasing) order, according to various examples. Examples in accordance with the principles described herein have application in computer systems and related data processing systems. In particular, examples described herein provide LSSRAM that may be useful for a wide variety of data processing systems and data processing tasks performed by such systems.

According to various examples, the list of stored data organized as a group of data words may be sorted (e.g., into either an ascending order or a descending order) within the memory entirely within the LSSRAM. In particular, the list sort takes place entirely within the LSSRAM (e.g., within a memory chip or chip set that implements the LSSRAM) and the sort is generally accomplished substantially without using resources, such as a processor, that are outside of the LSSRAM. In particular, the sort of the list of data words may be accomplished using sort logic comprising circuitry (e.g., a sort circuit) of memory cells that make up the LSSRAM, according to various examples. Further, the sort does not involve data (e.g., data words) being moved between a processor and the memory, according to various examples.

According to some examples, sorting data to produce a sorted list of data words in the LSSRAM may be accomplished in less time, and in some examples in considerably less time, than is generally possible without using LSSRAM. In fact, the sort may be accomplished in substantially constant time (e.g., a fixed number of clock cycles) using LSSRAM, according to some examples. For example, the sort may be accomplished in a number of 'clock cycles' of the LSSRAM that is proportional to a number of bits in the data words of the sorted list, according to some examples.

In contrast, conventional memory that relies on a processor, for example, to perform a sort generally requires an amount of time that is proportional to an amount of data being sorted. For example, shifting data in conventional memory typically involves the processor reading the data to be sorted and then writing the data back to memory in another location. Reading and writing may be performed by the processor on a word-by-word basis due to the structure and functionality of conventional memory, for example. Since each piece of data (e.g., data word) in the data being sorted is first read from the conventional memory by the processor and then subsequently written back to the conventional memory, the time to sort the data is generally proportional to the amount or length of the data (e.g., number of data words) being sorted, for example. The larger the amount of data, the longer the sort operation will take.

Moreover, conventional memory relies on a resource (e.g., the processor) that is external to the conventional memory to perform the reading and writing when sorting the data. Since the resource performing the sort is external to the conventional memory, each of the data words involved in the word-by-word sort must pass between the external resource and the conventional memory through some form of data bus or similar communication channel. The data bus or similar communication channel may substantially limit a speed of the read and write operations and as a result, an overall speed of the sort. Hence, sorting large subsets of data words can become prohibitively expensive in terms of the processing time due to one or both of the effects of data bus speed and the proportional time aspects of performing a sort using conventional memory.

In accordance with the principles described herein, LSSRAM has built-in sorting capability so that data words are not read and then written by an external resource to perform a sort, for example. A list of stored data words is identified to the LSSRAM (e.g., using an address and a length) and the LSSRAM is instructed to sort the list. The sort is then accomplished by and takes place entirely within the LSSRAM. Speed limitations associated with transferring data to and from an external resource are substantially eliminated by LSSRAM, according to examples of the principles described herein. Moreover, time for sorting may be substantially independent of the length of the list of data words, for example.

In particular, sorting within the LSSRAM may be implemented with circuitry of the LSSRAM itself, according to the principles described herein. As such, sorting using LSSRAM does not require sequentially reading and writing each data word of the contiguous subset. For example, sorting using LSSRAM may sort all of the data words in the list in a substantially simultaneous manner. As such, the LSSRAM may implement sorting of the list in a time that is substantially independent of the length of the list of data words.

Herein, the term 'memory' refers to substantially any sort of memory that can receive and store data using cross-coupled elements. The memory is generally consistent with memory that may be employed by a computer processor or in a computer system as static main memory that retains data without need for periodic data refresh, for example. Other types of static memory according to the definition herein include, but are not limited to, various types of latches, flip-flops, and shift registers that employ one or both of latches and flip-flops, for example.

In particular, by definition herein, memory used for LSSRAM generally refers to any sort of memory that is or may be referred to as static random access memory (SRAM). SRAM is memory that substantially maintains data without needing to be refreshed, by definition herein. Typically, SRAM maintains data (e.g., as a programmed logic state) using a feedback loop or a cross-coupling between components or elements of the SRAM cell. For example, the cross-coupled elements may include, but are not limited to, cross-coupled inverters, cross-coupled NAND gates and cross-coupled NOR gates. Certain feedback loops used to implement some forms of SRAM or SRAM-like circuits are also considered as cross-coupled elements, by definition herein. Further herein, LSSRAM employs, by definition, a particular and unique type of SRAM cell referred to as a 'list sort' static random access memory (LSSRAM) cell. The LSSRAM cell is described in more detail below.

Also herein, a memory (e.g., a LSSRAM) may comprise a plurality of memory cells (e.g., LSSRAM cells or a mixture of LSSRAM cells and other memory cells) arranged as an array, according to various examples. For example, the memory cells may be arranged as a two dimensional (2-D) array. The 2-D array may be arranged as a rectangular 2-D array of memory cells comprising a plurality of rows (i.e., a plurality of horizontally oriented linear arrays) and a plurality of columns (i.e., a plurality of vertically oriented linear arrays), for example. As used herein, a 'row' is defined as a collection or grouping of memory cells arranged in a one-dimensional (1-D) array (e.g., a linear array). Similarly, a 'column' is defined as a collection of grouping of memory cells arranged in another linear array that is or may be oriented perpendicular to a row in the 2-D array. As such, the 2-D array may comprise a plurality of rows arranged in a substantially parallel manner and a plurality of columns also arranged in a substantially parallel manner, that are orthogonal to the rows, for example. In general, a particular memory cell is a member of both a row and a column. Higher order (e.g., three or more dimensions) arrays also may be employed.

In some examples, a lower order array (e.g., a linear array) is defined on an array with a larger dimension (e.g., 2-D array). A three dimensional (3-D) arrangement of memory cells may be realized using a plurality of adjacent 2-D arrays, according to some examples. In addition, arrays may be divided into sub-arrays. For example, a 2-D rectangular array may be divided into quadrants as four sub-arrays. In another example, the 2-D rectangular array may be divided into sub-groups of adjacent columns. In some examples, the column subgroups may have a width corresponding to a number of memory cells used to hold or represent a data word as is discussed below.

Further herein, a row comprising a grouping of memory cells may hold data (e.g., a plurality of data bits) that constitute one or more data words of a particular computer system. According to various examples, the memory cells of a row are physically adjacent to one another. For example, a first memory cell of a row may be located immediately next to a second memory cell of the row, and so on from the beginning end (e.g., left end) of the row to the terminal end (e.g., right end) of the row. A row may comprise a relatively large number of memory cells. For example, a length of a row may be 1024 data bits, 2048 data bits, 4096 data bits, or more, in various practical implementations, according to examples in accordance with the principles described herein.

A memory cell (e.g., a LSSRAM cell) is a circuit or a related construct that holds, retains or stores data, as defined and employed herein. Further, by definition herein, a memory cell may generally store a single 'bit' of data, according to some examples. For example, the bit may represent a binary value (e.g., '0' or '1') and the memory cell may hold a single, particular binary value at any given moment in time. Also by definition herein, a data word may comprise one or more bits of data generally stored in one or more adjacent memory cells. For example, a data word may comprise 4, 8, 16, 32 or 64 binary bits stored in a corresponding number of memory cells. The memory cells may be adjacent memory cells, for example. In some examples, the adjacent memory cells that store a data word are arranged in or along a length of a row of the array of memory cells. Similarly, data words may be arranged in or along a length or extent of a subgroup of columns. For example, each row of the column subgroup may hold a different one of a plurality of data words. The subgroup of columns may be referred to as a data word column or even a column for simplicity of discussion.

Memory cells (e.g., LSSRAM cells of LSSRAM) organized in rows and columns of a 2-D array are also often referred to as 'memory locations' herein. Strictly speaking, a memory location is a memory cell(s) at a particular location within the memory, the location being designated or identified by an address (e.g., of a particular row and a particular column). The memory cell may be accessed using the address, for example. However, for simplicity of discussion herein, the memory cells themselves are often referred to as having or being at an address. Similarly, a data word comprising a plurality of memory cells may be designated or identified by an address, in some examples. The address may correspond to an address of a first memory cell of the plurality that makes up the data word, for example. As such, a data word may be referred to as having or being at a memory location or equivalently at a data word location or data word address (or simply an 'address') in memory. In addition, 'location' may be used to refer to a location of a contiguous subset of data words that is designated by a starting address (e.g., starting data word location or address) and an ending address (e.g., ending data word location or address), according to some examples.

According to various examples, the LSSRAM may be a portion of a main memory of a general-purpose computer system. The LSSRAM may represent a subset of the memory that makes up the main memory, for example. In another example, the LSSRAM may be a shift register. The shift register may have a single memory cell in each row, for example. In another example, the shift register may have a full data word in each row and thus comprise a plurality of columns.

Herein, a 'list sort' is a sort that orders data words in a list of data words according to a relative value of the data words. In some examples, the list sort may order the data words in substantially ascending order (i.e., non-decreasing order) according to the relative values of the data words. In other examples, the data words may be ordered according to the relative values in substantially descending order (i.e., non-increasing order) by the list sort. According to various examples, the list sort may produce the sorted list by swapping data words of the list in an iterative manner. In some examples, the iterative swapping of data words may proceed until the list is substantially sorted while in other examples, the iterative swapping may be terminated before the sort is completed.

Figures 1A, 1B:
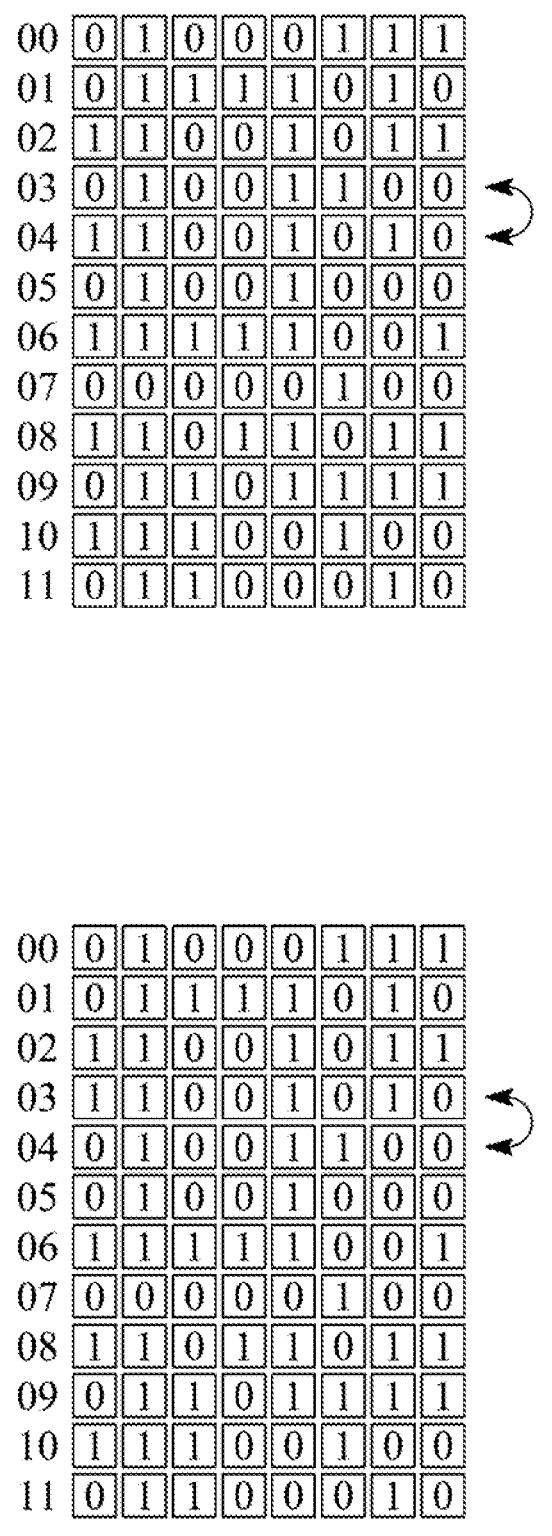

FIGS. 1A-1B illustrate a list of data words, according to an example consistent with the principles described herein. In particular, FIG. 1A illustrates a list of data words before a pair of data words is swapped during a list sort, according to some examples. The data words are 8-bit data words and are organized in rows labeled by a row address (e.g., 00 to 11). FIG. 1B illustrates the list of data words of FIG. 1A after a pair of data words has been swapped. Swapping, by definition herein, exchanges entire data words stored in a pair of memory locations, as illustrated. In particular, data word 01001100 at row 03 and data word 11001010 at row 04 have been swapped, as illustrated. A double headed curved arrow in FIGS. 1A and 1B illustrates the swapping of the data words.

Further, as used herein, the article 'a' is intended to have its ordinary meaning in the patent arts, namely 'one or more'. For example, 'a memory cell' means one or more memory cells and as such, 'the memory cell' means 'the memory cell(s)' herein. Also, any reference herein to 'top', 'bottom', 'upper', 'lower', 'up', 'down', 'front', 'back', 'left' or 'right' is not intended to be a limitation herein. Further, the terms 'column' and 'row' are arbitrary designations to describe substantially orthogonal structures when employed in or describing an array. As such, a row may be viewed as a column and a column may be viewed as a row under an appropriate rotation of an array or similar structure containing the rows and columns. Herein, the term 'about' when applied to a value generally means within the tolerance range of the equipment used to produce the value, or in some examples, means plus or minus 10%, or plus or minus 5%, or plus or minus 1%, unless otherwise expressly specified. Moreover, examples herein are intended to be illustrative only and are presented for discussion purposes and not by way of limitation.

FIG. 2 illustrates a block diagram of a list sort static random access memory (LSSRAM) unit cell 100, according to an example consistent with the principles described herein. According to various examples, the LSSRAM unit cell 100 is defined as a memory cell that provides both a dynamic storage mode and a static storage mode. In particular, the LSSRAM unit cell 100 may be selectably operated in or switched in situ between the dynamic storage mode and the static storage mode. When operated in static storage mode, the LSSRAM unit cell 100 acts substantially similar to an SRAM cell to maintain stored data without refresh. Alternatively, when switched to dynamic storage mode, the LSSRAM unit cell 100 exhibits a time decay of stored data that substantially mimics dynamic random access memory (DRAM), for example. The time decay may be provided by a capacitance (e.g., a gate capacitance) of an element or elements of the LSSRAM unit cell 100, for example. According to some examples, the dynamic storage mode is employed when the LSSRAM unit cell 100 is operated to swap data between adjacent LSSRAM unit cells 100. Operation to swap data may be used to sort a list of data (hence 'list sort'), according to some examples.

As illustrated, the LSSRAM unit cell 100 has an input port 102 (the terms 'input port' and 'input' may be used interchangeably) to receive data and output ports 104, 106 (the terms 'output port' and 'output' may be used interchangeably) to output data stored by the LSSRAM unit cell 100. In some examples, the input port 102 may be employed to receive and couple data into the LSSRAM unit cell 100 while the output ports 104, 106 may be employed to transfer data out of the LSSRAM unit cell 100. Specifically, when the LSSRAM unit cell 100 is operated to swap data utilizing a combination of the dynamic storage mode to load data and the static storage mode to store the loaded data, the input port 102 may be connected to the output port 104, 106 of an adjacent memory cell (e.g., an adjacent LSSRAM unit cell 100', further described below). The adjacent memory cell supplies the data being loaded into and stored by the LSSRAM unit cell 100. Each of the output ports 104, 106 the LSSRAM unit cell 100 may be connected to an input port of a different adjacent memory cell to facilitate transmitting data stored in the LSSRAM unit cell 100 to the adjacent memory cells, according to some examples. In various examples, the connection may be substantially temporary, being in existence only while the LSSRAM unit cell 100 is in the dynamic storage mode.

In some examples, the LSSRAM unit cell 100 may have other input/output (I/O) ports (not illustrated FIG. 2). For example, the LSSRAM unit cell 100 may have one or more other I/O ports in communication with a bit line or a pair of bit lines of a memory array that employs the LSSRAM unit cell 100. The other I/O ports may be used to one or both of write data to and read data from the LSSRAM unit cell 100 when the LSSRAM unit cell 100 is operated in static storage mode as a memory cell of a random access memory array (e.g., as an SRAM array), for example. The bit line(s) are not explicitly depicted in FIG. 2 for simplicity of illustration, but will be addressed below (e.g., see FIGS. 5A-5B, below).

Further, FIG. 2 illustrates a plurality of LSSRAM unit cells 100 arranged and interconnected in a column, by way of example and not limitation. In particular, two LSSRAM unit cells 100 out of the plurality of LSSRAM unit cells 100 that constitute the column are illustrated in FIG. 2. As illustrated, an output port 106 of a particular LSSRAM unit cell 100' the plurality is connected to an input port 102 of an adjacent LSSRAM unit cell 100" above the particular LSSRAM unit cell 100' in the column. In some examples, the output port 104 of the particular LSSRAM unit cell 100' may also be connected to an input port of another adjacent LSSRAM unit cell (not illustrated) that is below the particular LSSRAM unit cell 100' in the column. Further as illustrated, the output port 104 of the adjacent LSSRAM unit cell 100" above the particular LSSRAM unit cell 100' in the column is connected to the input port 102 of the particular LSSRAM unit cell 100'. In some examples, the input port 102 of the particular LSSRAM unit cell 100' may also be connected to an output port of the other adjacent LSSRAM unit cell (not illustrated) below the particular LSSRAM unit cell 100' in the column.

The connections between the LSSRAM cells 100 may facilitate swapping data between the LSSRAM unit cells 100, for example. In particular, the swapping may be either between the particular LSSRAM unit cell 100' and the adjacent LSSRAM unit cell 100", or the particular LSSRAM unit cell 100' and the other adjacent LSSRAM unit cell (below and not illustrated in FIG. 2), or the adjacent LSSRAM unit cell 100" and another adjacent LSSRAM unit cell (above and not illustrated in FIG. 2), according to various examples. Also according to some examples (not illustrated), one or both of the above-adjacent memory cell and the below-adjacent memory cell (not illustrated) in the column may be realized as other than a LSSRAM unit cell (e.g., as a conventional SRAM cell). Further, the column illustrated in FIG. 2 may be either a stand-alone column (e.g., implementing a 1-bit wide data word) or a representative column of a plurality of columns that together represent a plurality of multi-bit data words of a 2-D memory array, according to various examples.

Referring further to FIG. 2, the LSSRAM unit cell 100 comprises a static random access memory (SRAM) cell 110. According to various examples, the SRAM cell 110 is a memory cell configured to provide substantially static data storage without a need for data refresh to maintain the stored data. As illustrated, the SRAM cell 110 comprises a pair of cross-coupled elements 112, 114. The cross-coupled elements 112, 114 are configured to provide data storage through or as a result of a cooperative interaction or a 'cross coupling' between the cross-coupled elements 112, 114. In particular, the cross coupling of the cross-coupled elements 112, 114 may act as a signal feedback loop that cooperatively reinforces a programmable logic state of the SRAM cell 110 to store the data, according to various examples.

A circuit (e.g., a driver) external to the SRAM cell 110 may provide programming of the programmed logic state, in some examples. For example, programming may be provided by a driver via bit lines (not illustrated). After programming, the cross coupling maintains the programmed logic state, according to some examples. In some examples, the cross-coupled elements 112, 114 of the SRAM cell 110 are also often referred to as a latch or latch circuit.

In some examples, the cross-coupled elements 112, 114 comprise a pair of cross-coupled inverters 112, 114. In some examples, the pair of cross-coupled inverters 112, 114 may comprise a first inverter 112 cross-coupled by a cross-coupling connection to a second inverter 114. In some examples, the first and second inverters 112, 114 may be cross-coupled such that an output signal of the first inverter 112 is communicated by the cross-coupled connection to an input of the second inverter 114. Similarly, the cross-coupled connection may communicate an output signal of the second inverter 114 to an input of the first inverter 112, for example. The operation of the inverters 112, 114 in conjunction with the cross-coupling connection functions as a feedback or coupled circuit that is bi-stable having the capability to store data. In other examples (not illustrated in FIG. 2), elements other than or in addition to a pair of inverters 112, 114 may be employed as the cross-coupled elements 112, 114.

Further as illustrated in FIG. 2, the LSSRAM unit cell 100 further comprises a dynamic/static (D/S) mode selector 120. The D/S mode selector 120 is configured to selectably switch the LSSRAM unit cell 100 between the dynamic storage mode and the static storage mode. When the D/S mode selector 120 switches the LSSRAM unit cell 100 into static storage mode, the SRAM cell 110 maintains a programmed logic state substantially without decay or degradation (i.e., at least until the SRAM cell 110 is reprogrammed). Alternatively, when the D/S mode selector 120 selectably switches the LSSRAM unit cell 100 to dynamic storage mode, the logic state previously stored in or by the SRAM cell 110 decays over time, by definition herein.

According to various examples, the D/S mode selector 120 is configured to produce the dynamic storage mode by interrupting the signal feedback loop of the SRAM cell 110. In particular, the signal feedback loop is interrupted by substantially breaking or decoupling the cross-coupling connection between the cross-coupled elements 112, 114 of the SRAM cell 110. Decoupling the cross-coupling connection also substantially isolates the cross-coupled elements 112, 114 from one another, according to some examples.

According to some examples, the D/S mode selector 120 comprises a switch to selectably couple and decouple/isolate the pair of cross-coupled elements 112, 114 of the SRAM cell 110. The dynamic storage mode of the LSSRAM unit cell 100 corresponds to the cross-coupled elements 112, 114 being decoupled and the static storage mode corresponds to the cross-coupled elements being coupled. Thus, selectably decoupling the cross-coupled elements 112, 114 of the pair using the switch produces the dynamic storage mode of the LSSRAM unit cell 100 while selectably coupling between the pair of cross-coupled elements 112, 114 with the switch provides the static storage mode, according to various examples.

In some examples, the switch may be located in or be a part of the cross-coupling connection. For example, the switch may comprise a first switch 122. The first switch 122 may be connected between the output of the first cross-coupled element 112 (e.g., first inverter 112) and the input of the second cross-coupled element 114 (e.g., second inverter 114) as part of the cross-coupling connection, for example. When the first switch 122 is turned off or is in an OFF condition or state (e.g., a high impedance condition or an open switch), the output of the first cross-coupled element 112 is substantially disconnected or decoupled and isolated from the input of the second cross-coupled element 114. Alternatively, when the first switch is turned on or in an ON condition or state (e.g., a low impedance condition or a closed switch), coupling is facilitated between the first cross-coupled element output and the second cross-coupled element input. The first switch 122 may be controlled by or according to a control signal F1, for example.

In some examples, the switch may further comprise a second switch 124. The second switch 124 may be connected, as part of the cross-coupling connection, between the output of the second cross-coupled element 114 (e.g., second inverter 114) and the input of the first cross-coupled element 112 (e.g., first inverter 112), for example. When the second switch 124 is turned off or in an OFF state (e.g., a high impedance condition or an open switch), the output of the second cross-coupled element 114 is substantially disconnected or decoupled and isolated from the input of the first cross-coupled element 112. Alternatively, when the second switch is turned on or in an ON state (e.g., a low impedance condition or a closed switch), coupling is facilitated between the second cross-coupled element output and the first cross-coupled element input. The second switch 124 may be controlled by or according to a control signal B1, for example.

According to some examples, the D/S mode selector 120 may configure the LSSRAM unit cell 100 to operate in the dynamic storage mode when both of the first and second switches 122, 124 are in the OFF state. The selectable decoupling provided by the first and second switches 122, 124 may substantially defeat the cross-coupling of the cross-coupled inverters 112, 114, to provide the dynamic storage mode, according to some examples. Further, the selectably decoupling substantially isolates the cross-coupled inverters 112, 114 from one another. According to various examples, one or both of the first and second switches 122, 124 may comprise a transistor switch. Examples of a transistor switch include, but are not limited to, a series-connected metal oxide (MOS) transistor (e.g., an NMOS or a PMOS transistor) and a transmission gate comprising a parallel connection of an NMOS transistor and a PMOS transistor.

In some examples, the LSSRAM unit cell 100 further comprises a swap selector 130. The swap selector 130 is configured to swap the stored data with data stored in an adjacent memory cell. The adjacent memory cell may be another LSSRAM unit cell 100 (e.g., the above-adjacent LSSRAM unit cell 100"), for example. The swap selector 130 swaps the stored data during the dynamic storage mode when the swap selector 130 is activated.

In particular, as illustrated in FIG. 2, the swap selector 130, when activated, connects or couples data of the particular LSSRAM unit cell 100 to an input of the SRAM cell 110 of the adjacent LSSRAM unit cell 100" (e.g., to an input of the first inverter 112). The coupled data is communicated out of the particular LSSRAM unit cell 100' through port 106, as illustrated. The activated swap selector 130 also connects or couples data at the output port 104 of the adjacent LSSRAM unit cell 100" to an input of the SRAM cell 110 of the particular LSSRAM unit cell 100' (e.g., to an input of the first inverter 112). The data coupled from the adjacent LSSRAM unit cell 100" is communicated through the input port 102 of the particular LSSRAM unit cell 100', as illustrated. The coupled data may be data at respective outputs of the second cross-coupled elements 114 (e.g., second cross-coupled inverters 114) in each of the two LSSRAM cells 100, for example. Further, when not activated, the swap connector 130 substantially isolates the two LSSRAM cells 100 from one another, according to various examples.

According to various examples, the connections provided by the activated swap selector 130 act to transfer data between the LSSRAM cells 100. Since the swap selector 130 is activated while the two LSSRAM cells 100 are in the dynamic storage mode, the first and second cross-coupled elements 112, 114 are substantially isolated from one another by the D/S mode selector 120. The connections couple data stored dynamically by the second cross-coupled elements 114 of one LSSRAM cell 100 to the first cross-coupled elements 112 of an adjacent LSSRAM cell 100 to which the data is transferred, according to various examples. Once the data is transferred, the swap selector 130 may be inactivated and the LSSRAM cells 100 may be switched back into static storage mode to store the transferred data, completing the data swap, according to various examples. Also note that the isolation of the first and second cross-coupled elements 112, 114 provided in dynamic storage mode substantially eliminates development of a race condition while the swap selector 130 is coupling the inputs and outputs of the adjacent LSSRAM cells 100.

In some examples, (e.g., as illustrated in FIG. 2), the swap selector 130 comprises a first switch 132 and a second switch 134. The first switch 132 is configured to selectably connect an output of the SRAM cell 110 of the LSSRAM unit cell 100' to the SRAM cell input of the adjacent LSSRAM unit cell 100" through the output 106 when the first switch 132 is in an ON state (i.e., closed). The second switch 134 is configured to selectably connect the output 104 of the adjacent LSSRAM unit cell 100" at the input 102 of the LSSRAM cell 100' to the SRAM cell 110 of the LSSRAM unit cell 100' when the second switch is in an ON state (i.e., closed). Activation of the swap selector 130 swaps the stored data by transferring the data through the switches 132, 134 of the swap selector 130.

In some examples, the swap selector 130 is configured to be activated and selectably transfer the data by receipt of a logic '1'. For example, the swap selector 130 may be activated by the logic '1' received at an input of the swap selector 130. The logic '1' may close the first and second switches 132, 134, to place the switches in the ON state, for example. The first and second switch 132, 134 may be implemented by NMOS switches and the logic '1' may produce a positive gate-source voltage on the NMOS switch of sufficient magnitude to place the NMOS switch in a low-impedance state, for example.

Figure 3A:
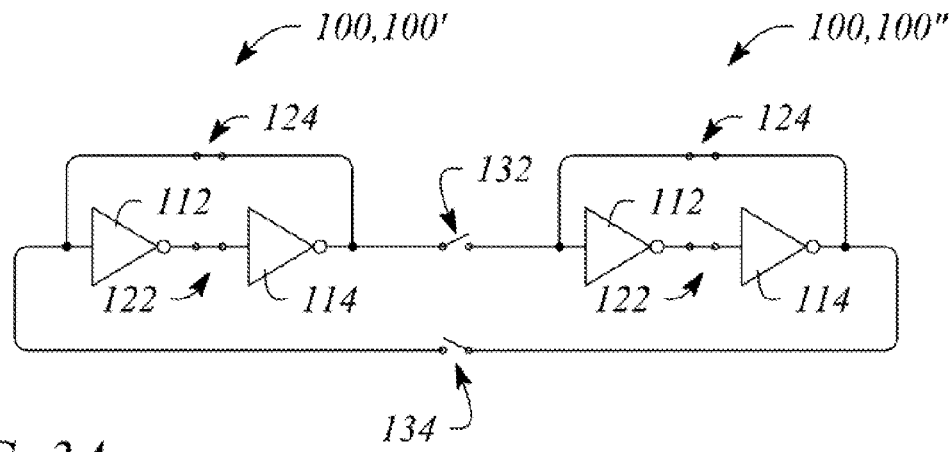
FIGS. 3A-3F illustrate a block diagram depicting a sequence of switch states of and interconnections between a pair of LSSRAM unit cells during a data swap, according to an example consistent with the principles described herein.

FIGS. 3A-3F illustrate a block diagram depicting a sequence of switch states of and interconnections between a pair of LSSRAM unit cells 100 during a data word swap, according to an example consistent with the principles described herein. In particular, as illustrated in FIG. 3A, both of a first LSSRAM unit cell 100' and a second LSSRAM unit cell 100" are in the static storage mode with both of the D/S mode selector switches 122, 124 in an ON state (i.e., closed) to facilitate coupling of the respective pair of cross-coupled elements 112, 114 of each of the LSSRAM unit cells 100. Further, the first and second swap selector switches 132, 134 are open or in the OFF state to isolate the LSSRAM unit cells 100 of the pair from one another, as illustrated in FIG. 3A.

Figure 3B:
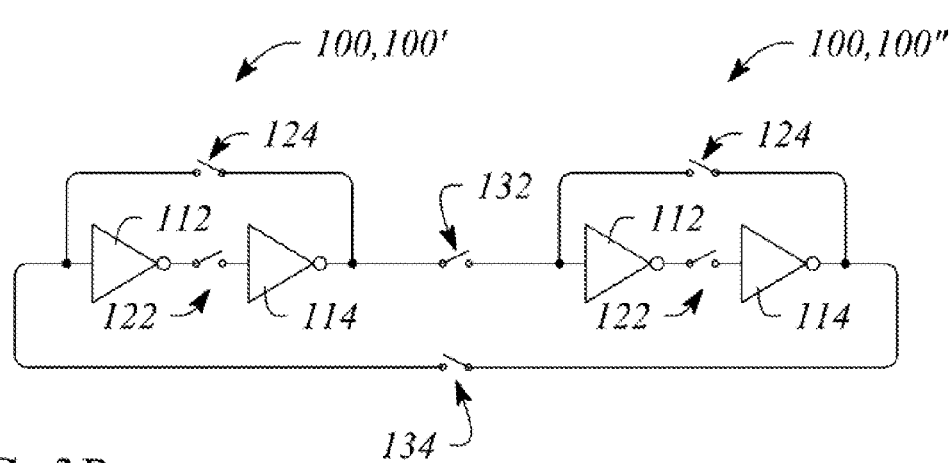

FIG. 3B illustrates the pair of LSSRAM unit cells 100 in dynamic storage mode after beginning the data swap sequence. In particular, the D/S mode selector switches 122, 124 have been opened (i.e., are in an OFF state) to isolate the first cross-coupled element from the second cross-coupled element 114 in each of the first and second LSSRAM unit cells 100', 100", as illustrated. Data stored by each of the LSSRAM unit cells 100 is retained dynamically by the isolated cross-coupled elements 112, 114 when the D/S mode selector switches 122, 124 are opened.

Figure 3C:
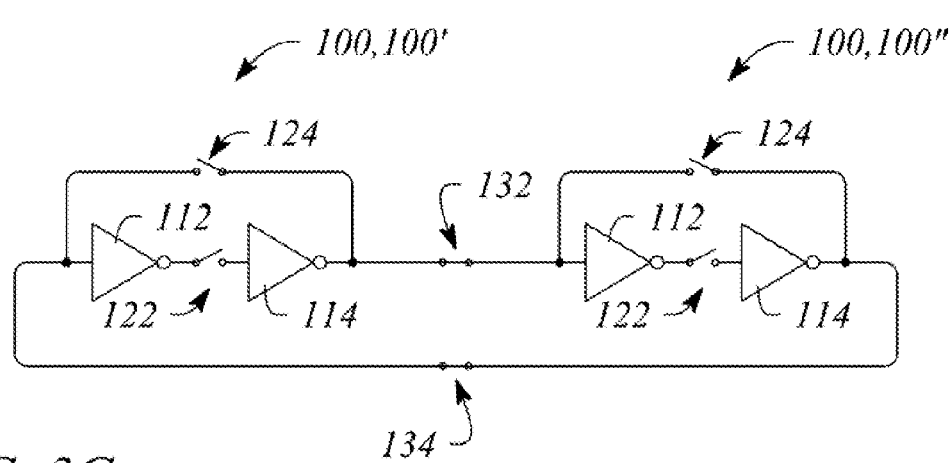

FIG. 3C illustrates the pair of LSSRAM unit cells 100 after the first and second swap selector switches 132, 134 have been closed to provide an ON state. The closed first swap selector switch 132 connects an output of the first LSSRAM unit cell 100' of the pair of LSSRAM unit cells 100 to an input of the second LSSRAM unit cell 100". Similarly, the closed second swap selector switch 134 connects an output of the second LSSRAM unit cell 100" to an input of the first LSSRAM unit cell 100'. The connections couple the dynamically stored data at the respective outputs to the respective inputs of the first and second LSSRAM unit cells 100', 100".

Figure 3D:
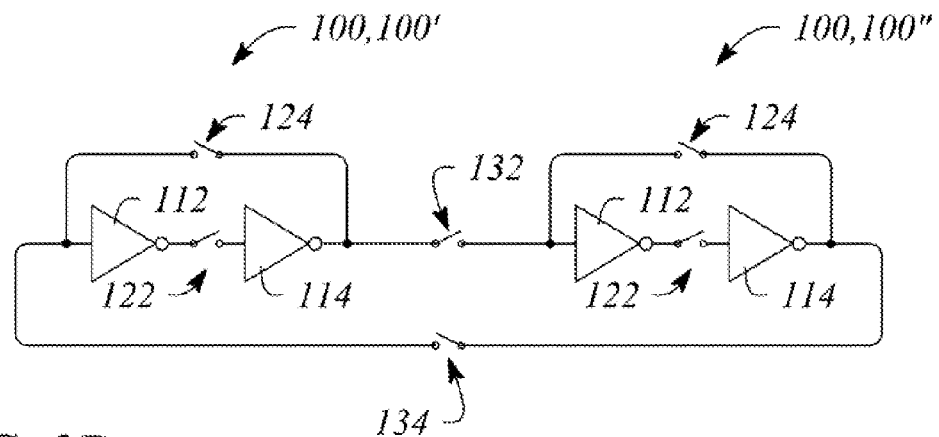

FIG. 3D illustrates the pair of LSSRAM unit cells 100 following the transfer of the dynamically stored data. As illustrated, the swap selector switches 132, 134 have been opened once again to isolate the LSSRAM unit cells 100 from one another. Isolating the LSSRAM unit cells 100 is performed in preparation for re-establishing the static storage mode.

Figure 3E:
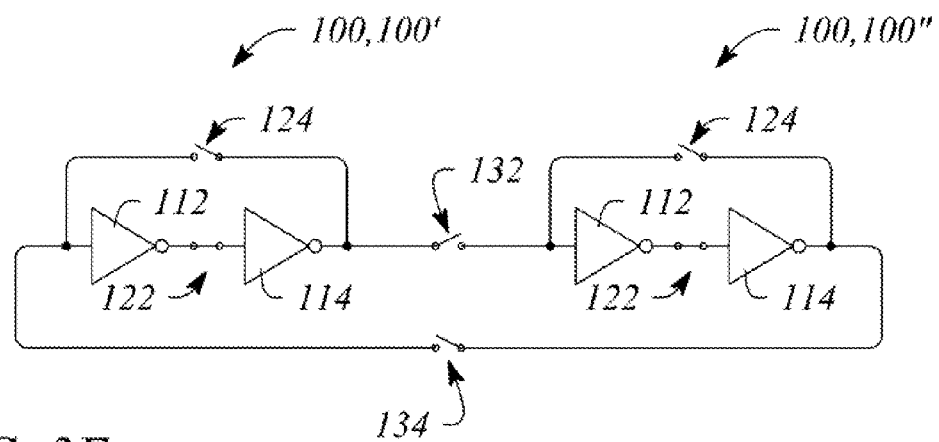
Figure 3F:
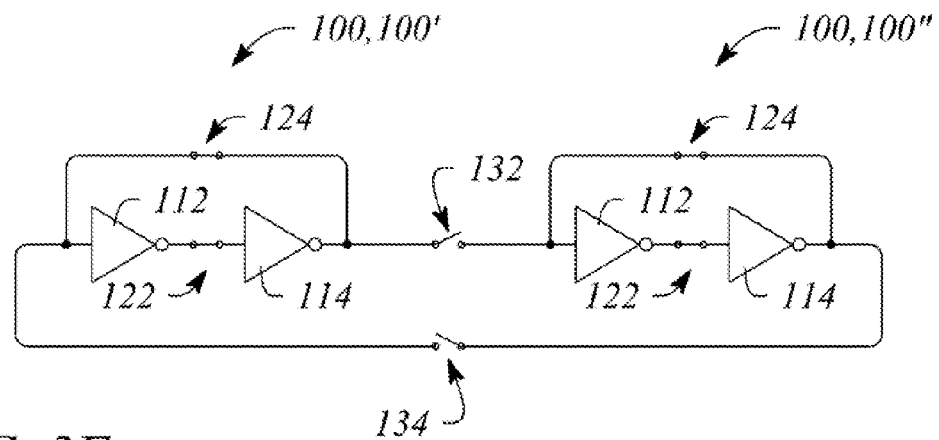

In FIG. 3E, the first D/S mode selector switches 122 of each of the LSSRAM unit cells 100 have been closed to begin re-establishment of the static storage mode, as illustrated. Closing the first D/S mode selector switches 122 couples the transferred dynamically stored data from the first cross-coupled element 112 to the second cross-coupled element 114. Finally, re-establishment of the static storage mode is completed by closing the second D/S mode selector switches 124 of each of the LSSRAM unit cells 100 of the pair, as illustrated in FIG. 3F. Once static storage mode is re-established, the data swap is considered complete.

Referring again to FIG. 2, the LSSRAM unit cell 100 further comprises a data comparator 140, according to various examples. The data comparator 140 is configured to compare the data stored in the SRAM cell 110 of the LSSRAM unit cell 100 with data stored in the adjacent memory cell (e.g., the below-adjacent LSSRAM unit cell 100). The data comparator 140 is further configured to activate the swap selector 130 according to or based on a result of the comparison. In some examples, the data comparator 140 is configured to activate the swap selector 130 when the data stored in SRAM cell 110 of the LSSRAM unit cell 100 is greater than the data stored in the adjacent memory cell. For example, the data comparator 140 may activate the swap selector 130 when the SRAM cell 110 stores a logic '1' and the adjacent memory cell stores a logic '0' (i.e., '1'>'0'). In other examples, the data comparator 140 may activate the swap selector 130 when the stored data of the SRAM cell 110 is less than the adjacent memory cell stored data. Activation based on the comparison may be determined by whether an ascending sort or a descending sort is being provided by the LSSRAM unit cell 100, for example.

Figure 4:
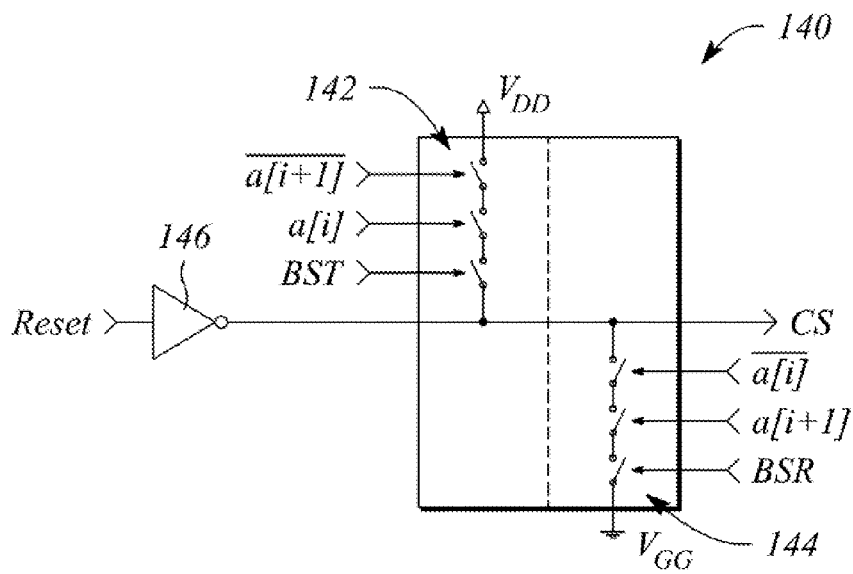
FIG. 4 illustrates a block diagram of a data comparator, according to an example consistent with the principles described herein.

FIG. 4 illustrates a block diagram of a data comparator 140, according to an example consistent with the principles described herein. As illustrated, the data comparator 140 comprises a first plurality of switches 142. The first plurality of switches are connected to a compare/swap (CS) line to provide an active logic level to the CS line when the switches 142 of the first plurality are in an ON state (i.e., closed), as illustrated. The active logic level provided to the CS line may be a logic '1' that is substantially equivalent to a voltage level of a positive supply voltage (e.g., $V_{DD}$), according to some examples. In particular, when the first plurality of switches 142 are closed, the CS line is 'pulled up' to a voltage level substantially similar to a voltage level of the positive supply voltage to provide the logic '1', for example as illustrated. In some examples, a data comparator 140 in or associated with any LSSRAM unit cell 100 along a first row of LSSRAM unit cells 100 may activate a swap of all of the LSSRAM unit cells 100 in the first row and a second, adjacent row.

According to some examples, a first switch of the first plurality of switches 142 may be activated (i.e., closed) by a logic '1' or logic high on or at an input to the SRAM cell of the LSSRAM unit cell. A second switch of the first plurality of switches 142 may be activated (i.e., closed) by a logic '0' on or at an input to the SRAM cell of the adjacent memory cell (e.g., adjacent LSSRAM unit cell), for example. As such, when the LSSRAM unit cell stores a logic '1' and the adjacent memory cell stores a logic '0' both the first and second switches of the first plurality of switches 142 will be activated or closed. In FIG. 4, the connection associated with the first plurality of switches 142 to the LSSRAM unit cell (e.g., the LSSRAM unit cell 100' of FIG. 2) is denoted as a[i] while the connection to the adjacent memory cell (e.g., the LSSRAM unit cell 100" of FIG. 2) is denoted $\overline{a[i+1]}$. The first plurality of switches 142 further comprises a third switch connected to a Bit Select Test (BST) line, as illustrated in FIG. 4. Asserting the BST line (i.e., applying a logic '1') when both the first and second switches of the first plurality of switches 142 are activated or closed will cause the CS line to be connected to the positive supply voltage producing an active logic level on the CS line (i.e., the CS line is 'pulled up' to a the positive supply voltage equal to a logic '1' state). On the other hand, if any of the switches of the first plurality of switches 142 are not closed (i.e., not activated or in an ON state), the CS line will not be pulled up to a logic '1'.

As illustrated in FIG. 4, the data comparator 140 further comprises a second plurality of switches 144. The second plurality of switches 144 are connected to the CS line to provide an inactive logic level (e.g., a logic '0') to the CS line when the switches of the second plurality of switches 144 are in an ON state (i.e., closed), as illustrated. The inactive logic level provided to the CS line may be a logic '0' that is substantially equivalent to a voltage level of a ground voltage (e.g., $V_{GG}$), according to some examples. In particular, when the second plurality of switches 144 are closed, the CS line is 'pulled down' to a voltage level substantially similar to a voltage level of the ground voltage to provide the logic '0', as illustrated.

According to some examples, a first switch of the second plurality of switches 144 may be activated (i.e., closed) by a logic '1' or logic high on or at an input to the adjacent memory cell. A second switch of the second plurality of switches 144 may be activated (i.e., closed) by a logic '0' on or at an input to the SRAM cell of the LSSRAM unit cell, for example. As such, when the LSSRAM unit cell stores a logic '0' and the adjacent memory cell stores a logic '1' both the first and second switches of the second plurality of switches 144 will be activated or closed. In FIG. 4, the connection associated with the second plurality of switches 144 to the LSSRAM unit cell (e.g., the LSSRAM unit cell 100' of FIG. 2) is denoted as $\overline{a[i]}$ while the connection to the adjacent memory cell (e.g., the LSSRAM unit cell 100" of FIG. 2) is denoted as a[i+1]. As illustrated in FIG. 4, the second plurality of switches 144 further comprises a third switch connected to a Bit Select Reset-Test (BSR) line. Asserting the BSR line (i.e., applying a logic '1') when both the first and second switches of the second plurality of switches 144 are activated or closed will cause the CS line to be connected to the ground voltage to produce an inactive logic level on the CS line (i.e., the CS line is pulled down to ground equivalent to a logic '0' state). On the other hand, if any of the switches of the second plurality of switches 144 are not closed, the CS line will not be pulled down to a logic '0'. Hence, selectively asserting either the BST line or the BSR line provides a determination of whether the data stored in the LSSRAM unit cell is greater or less than the data stored in the adjacent memory cell.

In some examples, a state of the CS line may be maintained in between comparisons using the BST line and the BSR line as a dynamic logic state. For example, the CS line may be sourced by a logic gate 146, as illustrated in FIG. 4. The logic gate 146 (i.e., represented by an inverter in FIG. 4) may be used to provide an initial logic state (e.g., to reset the CS line) prior to testing using the BST and BSR lines. Then the action of the data comparator 140 under the control of the BST and BSR lines can be used to set or reset the CS line according to a comparison of the data in the LSSRAM unit cell and the adjacent memory cell, according to various examples. In some examples, the BST line may be used in conjunction with a comparison of at a j-th test bit $TB_j$ while the BSR line may be used in comparisons involving more significant bits $b_k$, $k<j$, as described in more detail below.

Figure 5A:
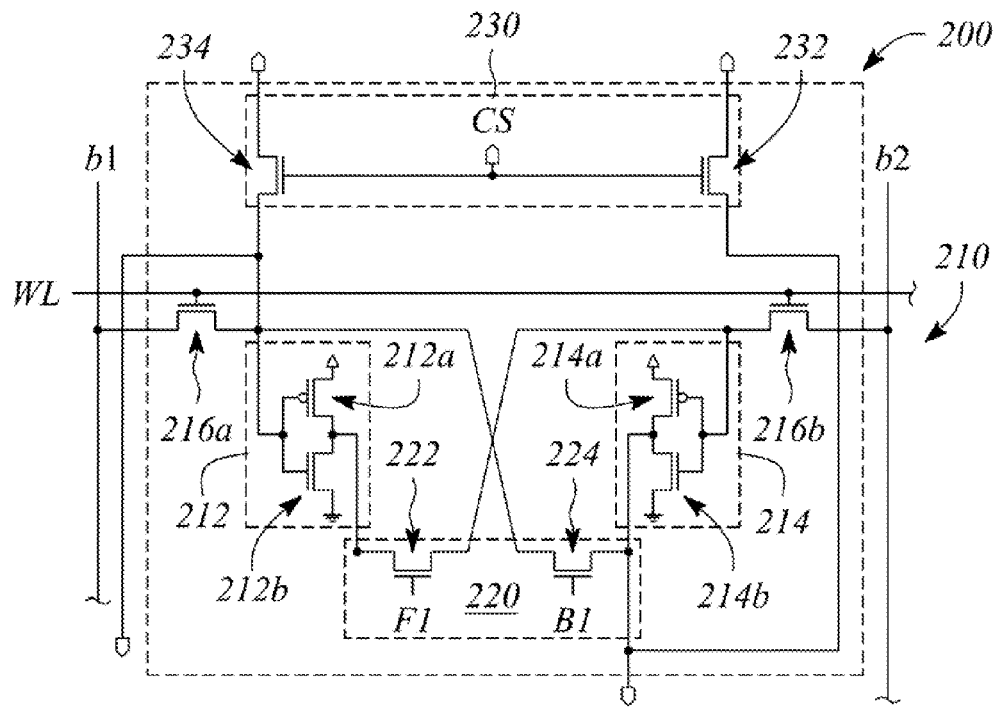
FIG. 5A illustrates a schematic diagram of a portion of an LSSRAM unit cell, according to an example consistent with the principles described herein.

FIG. 5A illustrates a schematic diagram of a portion of an LSSRAM unit cell 200, according to an example consistent with the principles described herein. According to some examples, the LSSRAM unit cell 200 illustrated in FIG. 5A may be substantially similar to the LSSRAM unit cell 100 described above with respect to FIG. 2. In particular, the LSSRAM unit cell 200 comprises an SRAM cell 210, a dynamic/static (D/S) mode selector 220, a swap selector 230, and a data comparator (not illustrated), each of which is substantially similar to respective ones of the SRAM cell 110, the D/S mode selector 120, the swap selector 130, and the data comparator 140 of the LSSRAM unit cell 100.

As illustrated in FIG. 5A, the SRAM cell 210 is a six-transistor (6 T) SRAM cell 210, for example. The illustrated 6 T SRAM cell 210 comprises a first inverter 212 implemented using a pair of transistors 212a, 212b and a second inverter 214 implemented using another pair of transistors 214a, 214b. A first or upper transistor 212a, 214a of each pair in the first and second inverters 212, 214 are illustrated in FIG. 5A as PMOS transistors, while a second or lower transistor 212b, 214b of each pair in the first and second inverters 212, 214 are illustrated as NMOS transistors by way of example and not limitation. The first inverter 212 is cross-coupled to the second inverter 214 by a cross-coupling circuit. The cross-coupled first and second inverters 212, 214 function to store data in the 6 T SRAM cell 210. The 6 T SRAM cell 210 further comprises a pair of access transistors 216a, 216b. The access transistors 216a, 216b connect to a pair of bit lines b1 and b2 to facilitate writing to and reading from the 6 T SRAM cell 210 when the LSSRAM unit cell 200 is operated as a memory cell of a random access memory in static storage mode. The access transistors 216a, 216b are activated by a word line WL and the bit lines b1 and b2 may be inverses of one another (e.g., b2=$\overline{b1}$), according to some examples.

As illustrated, the D/S mode selector 220 of the LSSRAM unit cell 200 comprises a pair of transistor switches 222, 224 in the cross-coupling circuit between the first and second inverters 212, 214. Asserting a control signal (e.g., at ports F1 and B1) that places the pair of transistor switches 222, 224 in an OFF condition (i.e., turning off the transistor switches 222, 224) decouples and isolates the cross-coupling of the first and second inverters 212, 214 from one another to provide the dynamic storage mode of the LSSRAM cell 200. The static storage mode is provided by a control signal (e.g., at ports F1 and B1) that places the transistor switches 222, 224 in an ON condition. As illustrated, the pair of transistor switches 222, 224 of the D/S mode selector 220 is illustrated as NMOS transistors, for example. In other examples (not illustrated), the D/S mode selector 220 may comprise PMOS transistors or a combination of NMOS and PMOS transistors.

Further as illustrated, the swap selector 230 comprises a pair of transistor switches 232, 234. Asserting a compare/swap (CS) line to turn ON the pair of transistor switches 232, 234 allows data to be coupled from an output of the LSSRAM unit cell 200 to an adjacent memory cell (not illustrated) and from an output of the adjacent memory cell to an input of the LSSRAM unit cell 200 in support of data swapping. As illustrated, the pair of transistor switches 232, 234 of the swap selector 230 is illustrated as a pair NMOS transistors, for example. In other examples (not illustrated), the swap selector 230 may comprise PMOS transistors or a combination of NMOS and PMOS transistors. In some examples, the swap selector 230 further comprises a second pair of transistor switches (not illustrated). The second pair of transistor switches is connected in series with the pair of transistor switches 232, 234 and may be used to select whether or not the LSSRAM unit cell 200 participates in data swapping, according to some examples. For example, the second set of transistor switches may be tied to or controlled by a row select line (not illustrated) that selects rows of an LSSRAM memory for participation in data swapping associated with a list sort.

Although not illustrated in Figure 5A, the data comparator comprises a first plurality of transistor switches and a second plurality of transistor switches. The first and second plurality of transistor switches may be substantially similar to the first and second plurality of switches 142, 144 described above, according to some examples. Comparison of data in the LSSRAM unit cell 200 with data in a connected, adjacent memory cell (e.g., another LSSRAM unit cell, also not illustrated) using the data comparator either asserts or does not assert (i.e., sets an active logic level or an inactive logic level on) the CS line connected to the swap selector 230. Results of the comparison by the data comparator may be shared among a plurality of the LSSRAM unit cell 200 in a row of an LSSRAM memory, according to various examples.

Figure 5B:
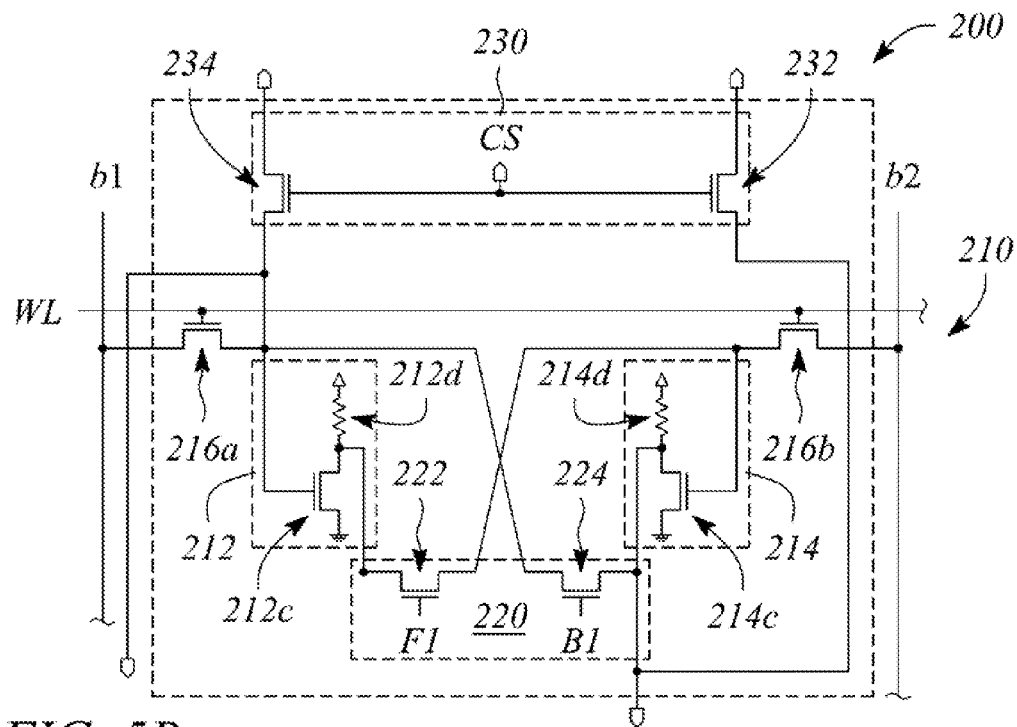
FIG. 5B illustrates a schematic diagram of a portion of an LSSRAM unit cell, according to another example consistent with the principles described herein.

FIG. 5B illustrates a schematic diagram of a portion of an LSSRAM unit cell 200, according to another example consistent with the principles described herein. In the example illustrated in FIG. 5B, the SRAM cell 210 is realized as a four-transistor (4 T) SRAM cell 210. The 4 T SRAM cell 210 is similar to the 6 T SRAM cell 210 except that the first and second inverters 212, 214 are each implemented using a single respective transistor 212c, 214c along with a respective bias resistor 212d, 214d, instead of a pair of transistors. Also similar to the 6 T SRAM cell 210, the LSSRAM unit cell 200 of FIG. 5B further comprises the D/S mode select 220 implemented by the pair of transistor switches 222, 224 (e.g., at ports F1 and B1), the swap selector 230 implemented by the pair of transistor switches 232, 234, and the data comparator (not illustrated), for example as described above.

Other SRAM cell configurations may be substituted for either of the 4 T SRAM cell 210 or the 6 T SRAM cell 210 illustrated in Figure 5A and 5B, according to some examples. For example, the 4 T SRAM cell 210 of FIG. 5B may be replaced by a so-called 'loadless' 4 T SRAM cell (not illustrated). In other examples, other SRAM cells such as, but not limited to, an eight-transistor (8 T) SRAM cell and a ten-transistor (10 T) SRAM cell (not illustrated) may be employed in place of the 6 T SRAM cell 210, illustrated in FIG. 5A. All such substitutions are within the scope of the principles described herein.

Figure 6:
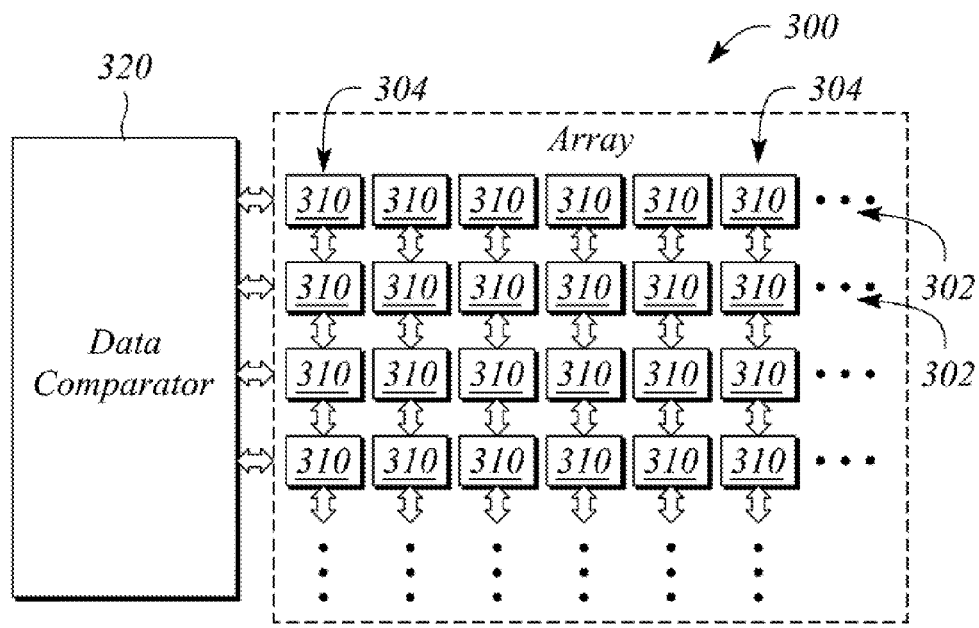
FIG. 6 illustrates a block diagram of a list sort random access memory (LSSRAM), according to an example consistent with the principles described herein.

FIG. 6 illustrates a block diagram of a list sort random access memory (LSSRAM) 300, according to an example consistent with the principles described herein. The LSS- RAM 300 comprises a plurality of list sort random access memory (LSSRAM) cells 310 arranged in an array having rows 302 to store data words. A number of LSSRAM cells 310 and also a number of columns 304 in the LSSRAM 300 correspond to a number of bits in a data word, as illustrated. As such, each row 302 includes a number of LSSRAM cells 310 corresponding to the width of a data word. In some examples, a column-group of LSSRAM cells 310 representing a column of data words may be arranged in a serpentine pattern in an LSSRAM 300 having rows 302 that are longer than a data word. Such an arrangement, while not illustrated, may be readily understood to be merely an extension of the concepts described above regarding the column-group of rows 302 illustrated in FIG. 6.

In various examples, the LSSRAM cells 310 of the plurality may be substantially similar to the LSSRAM unit cell 100 described above. In particular, in some examples, the LSSRAM cells 310 of the plurality may comprise a dynamic/static (D/S) memory cell and a swap selector. The D/S memory cell is configured to switch between a static memory mode and a dynamic memory mode in a manner analogous to portions of the LSSRAM unit cell 100 described above. Moreover, the LSSRAM cells 310 may be interconnected one to another along columns 304 in a manner similar to that described above with respect to the LSSRAM unit cell 100. According to various examples, the swap selector is configured to swap data words between the LSSRAM cells 310 of a first row and a second row of the LSSRAM memory 300. For example, the first and second rows may be adjacent to one another in the LSSRAM memory 300.

In particular, the D/S memory cell may comprise a static random access memory (SRAM) cell having a pair of cross-coupled elements to store data. The SRAM cell of the D/S memory cell may be substantially similar to the SRAM cell 110 described above with respect to the LSSRAM unit cell 100. Further, the D/S memory cell may comprise a dynamic/static (D/S) mode selector. The D/S mode selector is configured to selectably switch the LSSRAM cell between the dynamic storage mode and the static storage mode. The D/S mode selector may be substantially similar to the D/S mode selector 120 described above with respect to the LSSRAM unit cell 100.

Specifically, the D/S mode selector may comprise a decoupling switch between cross-coupled elements of the LSSRAM cell 310, in some examples. The decoupling switch of the D/S mode selector of the LSSRAM cell 310 may be configured to provide switching between a dynamic mode and a static storage mode using selectable coupling and decoupling of the cross-coupled elements, for example. The decoupling switch may be substantially similar to the switch, for example the pair of switches 122, 124, described above with respect to the LSSRAM unit cell 100, according to various examples.

In some examples, the swap selector may be substantially similar to the swap selector 130 described above with respect to the LSSRAM unit cell 100. In particular, the swap selector may comprise a first switch to selectably connect an output of the D/S memory cell to an input of an adjacent memory cell when the first switch is in an ON state. The swap selector may further comprise a second switch to selectably connect an input of the D/S memory cell to an output of the adjacent memory cell when the second switch is in an ON state. Activation of the swap selector swaps the stored data by closing the first and second switches to provide the ON state. The first and second switches of the swap selector may be substantially similar to the first and second switches 132, 134 of the swap selector 130, described above with respect to the LSSRAM unit cell 100, according to some examples. For example, when activated by a logic '1' on a CS line of the LSSRAM memory 300, the first and second switches may close to swap the data between corresponding LSSRAM cells 310 of the first and second rows 302.

Referring again to FIG. 6, the LSSRAM 300 further comprises a data comparator 320. The data comparator 320 is to compare data words in the first and second rows 302 of the LSSRAM 300. Further, the data comparator 320 is configured to activate the swap selector when the comparison indicates that a swap is to be performed. In some examples, the comparison indicates that a swap is to be performed when a data word of the first row 302 is greater than a data word of the second row 302. In some examples, the first row 302 may be above the second row 302 while in other examples, the first row 302 may be below the second row 302.

In some examples, the data comparator 320 may be distributed along the rows 302 and among the LSSRAM cells 310 of the rows 302. In particular, according to some examples, the data comparator 320 may be substantially similar to the data comparator 140 described above with respect to the LSSRAM unit cell 100. In these examples, the data comparator 320 may be considered to be part of the LSSRAM cells 310, for example. In particular, the data comparator 320 may comprise a first plurality of switches and a second plurality of switches corresponding to each LSSRAM cell 310. The first and second plurality of switches may be substantially similar to the first and second plurality of switches 142, 144 of the data comparator 140, described above with respect LSSRAM unit cell 100, according to some examples.

Figure 7:
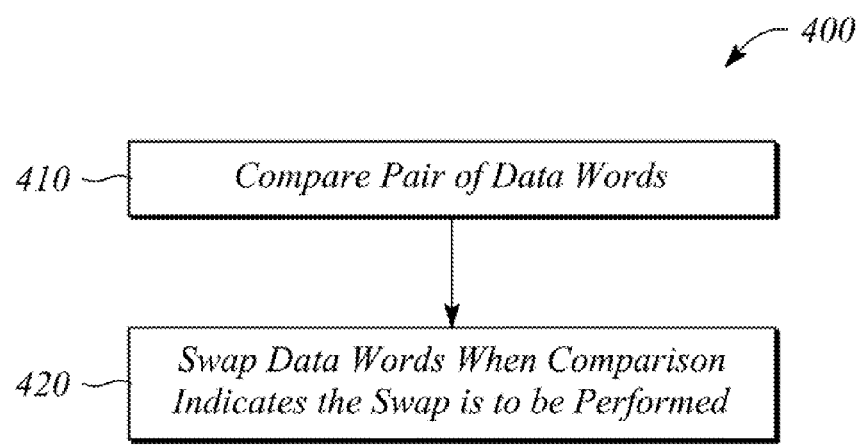
FIG. 7 illustrates a flow chart of a method of performing a list sort using list sort static random access memory (LSSRAM), according to an example consistent with the principles described herein.

FIG. 7 illustrates a flow chart of a method 400 of performing a list sort using list sort static random access memory (LSSRAM), according to an example consistent with the principles described herein. As illustrated, the method 400 of performing a list sort comprises comparing 410 a pair of data words to determine whether to perform a swap of the stored data words. According to various examples, the pair of data words is stored in a pair of dynamic/static (D/S) memory cells arranged in two rows in the LSSRAM. Further, each D/S memory cell comprises a dynamic/static (D/S) mode selector to switch the D/S memory cell between a dynamic storage mode and a static storage mode, according to various examples. In some examples, the D/S memory cell is substantially similar to the D/S memory cell described above with respect to the LSSRAM memory 300. In particular, the D/S memory cell may comprise a static random access memory (SRAM) cell that is substantially similar to the SRAM cell 110 described above with respect to the LSSRAM unit cell 100. Further the D/S memory cell may comprise a dynamic/static (D/S) mode selector that is substantially similar to the D/S mode selector 120 of the LSSRAM unit cell 100, described above.

The method 400 of performing a list sort further comprises swapping 420 the stored data words when the comparison 410 determines that the swap is to be performed. According to various examples, swapping 420 is performed by a swap selector to swap the stored data words between the D/S memory cells of the two rows. According to some examples, the swap selector is substantially similar to the swap selector 130 described above with respect to the LSSRAM unit cell 100.

According to some examples, swapping 420 the stored data words comprises performing a sequence of switch configurations and interconnections illustrated in FIGS. 3A-3F above. In particular, swapping 420 the stored data words may comprise switching D/S memory cells in the two rows from the static storage mode to the dynamic storage mode by decoupling cross-coupled elements of the D/S memory cells using the D/S mode selector. According to some examples, swapping 420 the stored data words further comprises activating the swap selector between the corresponding pairs the D/S memory cells in the two rows. Swapping 420 the stored data words further comprises coupling data through the activated swap selector from an output of a D/S memory cell in a first row of the two rows to an input of a corresponding D/S memory cell in a second row and from an output of the corresponding second row D/S memory cell to an input of the first row D/S memory cell to swap the data words, according to some examples. According to some examples, swapping 420 the stored data words further comprises storing the coupled data by switching the first and second row D/S memory cells back to the static storage mode using the D/S mode selector.

In some examples, comparing 410 a pair of data words is performed in a bit-wise manner comprising determining that a swap is to be performed if and only if a comparison of test bits of the data words in a pair indicates a swap and none of any bits that are more significant than the test bits invalidate the swap indication. In particular, data words may be compared to one another in a bit-wise manner beginning with a most significant bit serving as a test bit and progressing sequentially to less significant bits as test bits, in an iterative manner. The test bit $TB_j$ is a j-th bit of the data word that is being compared to determine whether a swap of the data words of a pair is indicated. The test bit may be compared using the BST line described above with respect to the data comparator 140, for example.

In a first iteration, the test bit $TB_j$ is the most significant bit of the data words of the pair (e.g., j=1 for an n-bit data word having bits number from 1 to n). In subsequent iterations, the test bit $TB_j$ may be moved (e.g., j=j+1) to point to a next most significant bit in the data word when no additional swaps are possible for the current test bit location in the data words. Further, during each iteration in which the test bit $TB_j$ indicates swap, each of any more significant bits above the test bit $TB_j$ (i.e., bits $B_k$ where k<j) is compared to determine if the indicated swap is valid. Only when a swap is validated does comparing 410 the pair of data words in a bit-wise manner determine that a swap should be made.

Comparing 410 the pair of data words in a bit-wise manner may be illustrated by an example in which a list of 4-bit data words is sorted according the method 400 of performing a list sort. The example provided below produces a list that is sorted in descending order, by way of example and not limitation. In a descending-order list sort, criteria for determining if a swap is indicated is whether or not a value of a first word of a pair of data words is less than a value of a second word in the pair. For example, let a[i+1] represent the first data word and let a[i] represent the second data word of the pair where the first data word a[i+1] is located above the second data word a[i]. Then, if a[i+1]<a[i], then a swap is indicated. This criteria may be interpreted in terms of the test bits $TB_j$ as: swap data words if and only if the test bit $TB_j$ of data word a[i+1] is less than the test bit $TB_j$ of the data word a[i] and none of any more significant bits $B_k$ of the data word a[i+1] is greater than a corresponding more significant bit $B_k$ of the data word a[i]. An ascending list sort may be provided according to some examples by switching 'greater than' and 'less than' in the above discussion.

Before the example list sort begins, the list of 4-bit data words, for example, may be given by Table 1:

TABLE 1

| Iterations for test bit $TB_j$, j = 1. |
|---|

| | | | | | | | | |
|---|---|---|---|---|---|---|---|---|
| A | 1001 | → | 1001 | → | 1001 | → | 1001 |
| B | 0111 | → | 0111 | ↘ | 1100 | → | 1100 |
| C | 0010 | ↘ | 1100 | ↗ | 0111 | ↘ | 1010 |
| D | 1100 | ↗ | 0010 | ↘ | 1010 | ↗ | 0111 |
| E | 0101 | ↘ | 1010 | ↗ | 0010 | → | 0010 |
| F | 1010 | ↗ | 0101 | → | 0101 | → | 0101 | where a first or left-most column provides fixed row label (i.e., A-F) and a second column adjacent to the first column contains the list of data words before a swap. A third column (i.e., of bold arrows) above indicates whether or not data words are swapped while a fourth or right-most column above shows a result of swapping 420 pairs of data words, as is explained below.

In a first iteration of the example list sort, comparing 410 in a bit-wise manner begins with the test bit $TB_j$ for j=1 and compares the most significant bits of each of the pairs of data words in the example list (e.g., data word pairs {A|B B|C C|D D|E E|F}). Upon performing the comparison 410, the test bit $TB_1$ of the first data word pair A|B indicates no swap since the test bit $TB_1$ of data word A is greater than the test bit $TB_1$ of data word B (i.e., 1>0). Similarly, no swap is indicated for either of the second data word pair B|C or the fourth data word pair D|E by the comparison 410 (e.g., 0=0 and 1>0, respectively). However, comparing 410 in a bit-wise manner the test bit $TB_1$ for each of the third data word pair C|D and the fifth data word pair E|F does indicate a swap since the test bit $TB_1$ of data word C is less than the test bit $TB_1$ of data word D (i.e., 0<1) and the test bit $TB_1$ of data word E is less than the test bit $TB_1$ of data word F (i.e., 0<1). A result of the first two pair-comparisons (A|B and B|C) is illustrated above by horizontal arrows in the third column and entries in the fourth column above showing that the data words A and B have been transferred without a swap. The result of the third and fifth data word pairs C|D and E|F are illustrated by non-horizontal arrows showing a direction of the swap as well as entries in the fourth column above showing that data words C and D along with data words E and F have been swapped. It should be noted that while the comparison of the fourth data word pair D|E did not indicate a swap, data word E was swapped with data word F in the E|F comparison, and data word D was swapped with data word C in the C|D comparison.

Subsequent iterations of comparing 410 in a bit-wise manner using the test bit $TB_j$ for j=1 result in further swaps as illustrated in a fifth through a seventh columns of Table 1 above. After the comparison 410 and swaps that result in the seventh column, no additional swaps are indicated for the test bit $TB_j$, j=1. Comparing 410 then proceeds with a next test bit $TB_j$, j=2, a third test bit $TB_j$, j=3 and so on until all of the bits in the data words have been employed as test bits.

For example, in a subsequent iteration, the list of 4-bit data words in rows A-F may be given as in a second column of Table 2 below as:

TABLE 2

| Iterations for test bit $TB_j$, j = 3 |
|---|

| | |
|---|---|
| A | 1100 → 1100 |
| B | 1001 ↘ 1010 |
| C | 1010 ↗ 1001 |
| D | 0111 → 0111 |
| E | 0101 → 0101 |
| F | 0010 → 0010 | where the test bit $TB_j$ is pointing at the third bit of the data words (i.e., j=3). In this iteration, comparing 410 in a bit-wise manner begins by comparing the test bit $TB_3$ of each of the data word pairs. The comparison of the test bits $TB_3$ initially suggests that the data word pairs B|C and E|F should be swapped. Comparing 410 then performs a comparison of each of the more significant bits $B_k$, k<3, to validate the results for the test bit comparison. The comparison of the more significant bits $B_k$, k<3 may be performed using the BSR line described above with respect to the data comparator 140, for example. In the case of the data word pair B|C, each of the pairs of more significant bits $B_k$ indicates that the swap indication is valid since in each case, the bit comparisons fail to find that data word B has a value that is greater than data word C. In particular, each of the more significant bits $B_k$ of the data word B is either equal to or less than a corresponding more significant bit $B_k$ of the data word C. Hence, the swap indicated by the test bit comparison is valid and the data words are swapped as indicated by the arrows and the respective data word entries in the fourth column above. However, for the data word pair E|F, the swap indicated by the test bit $TB_3$ comparison is not valid since at least one of the more significant bits $B_k$ of the data word E is greater than a corresponding more significant bit $B_k$ of the data word F. In particular, the more significant bit $B_2$ of data word E is greater than the corresponding more significant bit $B_2$ of the data word F (i.e., 1>0) indicating that the data word E has a value that is greater than the data word F. The comparisons 410 and corresponding swaps 420 continue until all of the bits in the data words of the pairs have been analyzed.

Thus, there have been described examples of a list sort static random access memory (LSSRAM) and an LSSRAM unit cell as well as a method of performing a list sort in or using an LSSRAM. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A list sort static random access memory (LSSRAM) unit cell comprising:
   a static random access memory (SRAM) cell having a pair of cross-coupled elements to store data;
   a dynamic/static (D/S) mode selector to selectably switch the LSSRAM unit cell between a dynamic storage mode and a static storage mode;
   a swap selector to swap the stored data with data stored in an adjacent memory cell during the dynamic storage mode when the swap selector is activated; and
   a data comparator to compare the stored data in the SRAM cell with the data stored in the adjacent memory cell and to activate the swap selector according to a result of the comparison.

2. The LSSRAM unit cell of claim 1, wherein the cross-coupled elements comprise a first inverter cross-coupled to a second inverter, and wherein the D/S mode selector comprises a first transistor switch connected between an output of the first inverter and an input of the second inverter, and a second transistor switch connected between an output of the second inverter and an input of the first inverter, the dynamic storage mode being provided by an OFF state of both of the first transistor switch and the second transistor switch to decouple the cross-coupled first and second inverters.

3. The LSSRAM unit cell of claim 1, wherein the SRAM cell is a six-transistor (6 T) SRAM cell.

4. The LSSRAM unit cell of claim 1, wherein the swap selector comprises:
   a first switch to selectably connect an output of the SRAM cell to an input of the adjacent memory cell when the first switch is in an ON state; and
   a second switch to selectably connect an output of the adjacent memory cell to an input of the SRAM cell when the second switch is in an ON state,
   wherein activation of the swap selector represents the first and second switches being in the ON state, and wherein the data stored respectively in the LSSRAM unit cell and the adjacent memory cell is transferred through the swap selector by way of the first and second switches.

5. The LSSRAM unit cell of claim 1, wherein the data comparator is to activate the swap selector when the SRAM cell stored data is greater than the adjacent memory cell stored data.

6. The LSSRAM unit cell of claim 1, wherein the data comparator comprises;
   a first plurality of switches connected to a compare/swap (CS) line to provide an active logic level to the CS line when the switches of the first plurality are in an ON state; and
   a second plurality of switches connected to the CS line to provide an inactive logic level to the CS line when the switches of the second plurality are in an ON state,
   wherein the CS line is connected to the swap selector, the active logic level on the CS line to activate the swap selector.

7. A list sort static random access memory (LSSRAM) comprising a plurality of the LSSRAM unit cell of claim 1 arranged in rows and columns, LSSRAM unit cells in each of the columns being connected to one another to swap data between adjacent ones of the LSSRAM unit cells of the respective column, wherein respective data comparators of the LSSRAM unit cells of each row to cooperatively control swapping data between adjacent rows of the LSSRAM unit cells using respective LSSRAM swap selectors.

8. A list sort static random access memory (LSSRAM) comprising:
   a plurality of LSSRAM unit cells arranged in an array of rows to store data words, each of the LSSRAM unit cells comprising a dynamic/static (D/S) memory cell and a swap selector, the swap selector when activated is to swap data words between LSSRAM unit cells of a first row and a second row adjacent to the first row; and
   data comparator to compare the data words in the first and second rows and to activate the swap selector when the comparison indicates that a swap is to be performed,
   wherein the comparison indicates that a swap is to be performed when a data word of the first row is greater than a data word of the second row.

9. The LSSRAM of claim 8, wherein the LSSRAM provides through successive swaps of data words in a column of the rows of the array a descending list sort of the data words when the first row is above the second row and an ascending list sort of the data words when the first row is below the second row.

10. The LSSRAM of claim 8, wherein the D/S memory cell of the LSSRAM unit cell comprises:
    a static random access memory (SRAM) cell having a pair of cross-coupled elements to store data; and
    a dynamic/static (D/S) mode selector to selectably switch the LSSRAM unit cell between a dynamic storage mode and a static storage mode, the D/S mode selector comprising a switch to selectably couple and decouple the pair of cross-coupled elements.

11. The LSSRAM of claim 8, wherein the swap selector comprises:
 a first switch to selectably connect an output of the D/S memory cell to an input of an adjacent memory cell when the first switch is an ON state; and
 a second switch to selectably connect an output of the adjacent memory cell to an input of the D/S memory cell when the second switch is in an ON state,
 wherein activation of the swap selector swaps the stored data by closing the first and second switches to provide the ON state.

12. A method of performing a list sort using a list sort static random access memory (LSSRAM), the method comprising:
 comparing a pair of data words to determine whether to perform a swap of the pair of data words, the pair of data words being stored in a pair of dynamic/static (D/S) memory cells arranged in two rows in the LSSRAM, each D/S memory cell comprising a dynamic/static (D/S) mode selector to switch the D/S memory cell between a dynamic storage mode and a static storage mode; and
 swapping the pair of data words when comparing the data word pair determines that the swap is to be performed, wherein swapping is performed by a swap selector to swap the pair of stored data words between the pair of D/S memory cells of the two rows.

13. The method of performing a list sort of claim 12, wherein swapping the stored data words comprises:
 switching the pair of D/S memory cells in the two rows from the static storage mode to the dynamic storage mode by decoupling cross-coupled elements of the D/S memory cell pair using corresponding D/S mode selectors of the WS memory cell pair;
 activating the swap selector between the pair of D/S memory cells in the two rows;
 coupling data through the activated swap selector from an output of a first cell of the D/S memory cell pair in a first row of the two rows to an input of a second cell of the D/S memory cell pair in a second row and from an output of the second D/S memory cell to an input of the first D/S memory cell to swap the pair of data words; and
 storing the coupled data by switching the pair of D/S memory cells hack to the static storage mode using the D/S mode selector.

14. The method of performing a list sort of claim 12, wherein each D/S memory cell further comprises a static random access memory (SRAM) cell having cross-coupled elements to store data of the data word in the static memory mode.

15. The method of performing a list sort of claim 12, wherein comparing a pair of data words comprises determining that a swap is to be performed if and only if a comparison of test hits of the data words in the pair indicates a swap and none of any bits that are more significant than the test hit invalidate the swap indication.

\* \* \* \* \*